(12) United States Patent
Suh

(10) Patent No.: US 6,940,568 B2
(45) Date of Patent: Sep. 6, 2005

(54) THIN FILM TRANSISTOR SUBSTRATE FOR LIQUID CRYSTAL DISPLAY (LCD) AND METHOD OF MANUFACTURING THE SAME

(75) Inventor: Hee-Sang Suh, Kyunggi-do (KR)

(73) Assignee: Iljin Diamond Co., Ltd. (KR)

( * ) Notice: Subject to any disclaimer, the term of this patent is extended or adjusted under 35 U.S.C. 154(b) by 0 days.

(21) Appl. No.: 10/864,262

(22) Filed: Jun. 9, 2004

(65) Prior Publication Data

US 2005/0001946 A1 Jan. 6, 2005

Related U.S. Application Data

(63) Continuation of application No. PCT/KR02/02345, filed on Dec. 12, 2002.

(51) Int. Cl.$^7$ ......................... G02F 1/1368; H01L 21/00
(52) U.S. Cl. .............................. 349/44; 257/72; 438/30
(58) Field of Search .............................. 349/43, 44, 110, 349/111, 122, 138, 187; 438/30; 30/151, 157; 257/59, 72

(56) References Cited

U.S. PATENT DOCUMENTS 5,615,030 A   3/1997  Harada et al. .............. 349/110
6,559,914 B1 * 5/2003  Jones et al. ................. 349/111

FOREIGN PATENT DOCUMENTS

JP        3148636      6/1991
JP        8136931      5/1996

* cited by examiner

Primary Examiner—Tarifur R. Chowdhury
Assistant Examiner—Tai Duong
(74) Attorney, Agent, or Firm—St. Onge Steward Johnston & Reens LLC

(57) ABSTRACT

Disclosed is a thin film transistor substrate for LCD, for preventing the increase of failed pixels due to opening of gate line by when opening of gate line occurs, allowing black matrix to perform the function of the gate line on behalf of the opened gate line. The substrate includes: black matrix arranged between adjacent unit pixels on transparent insulating substrate; first oxide film formed on black matrix; active polysilicon layer pattern formed at active region; second oxide film formed on resultant substrate including active polysilicon layer pattern, and including first contact hole exposing predetermined portion of black matrix; gate line formed on selected area of second oxide film and electrically contacting with black matrix through first contact hole; third oxide film formed on resultant substrate; data line formed on third oxide film; planarizing film formed on third oxide film including data line; and pixel electrode formed on planarizing film.

14 Claims, 4 Drawing Sheets

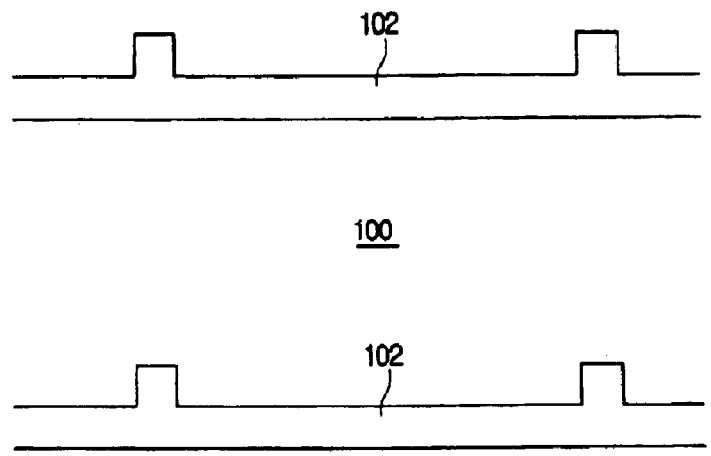
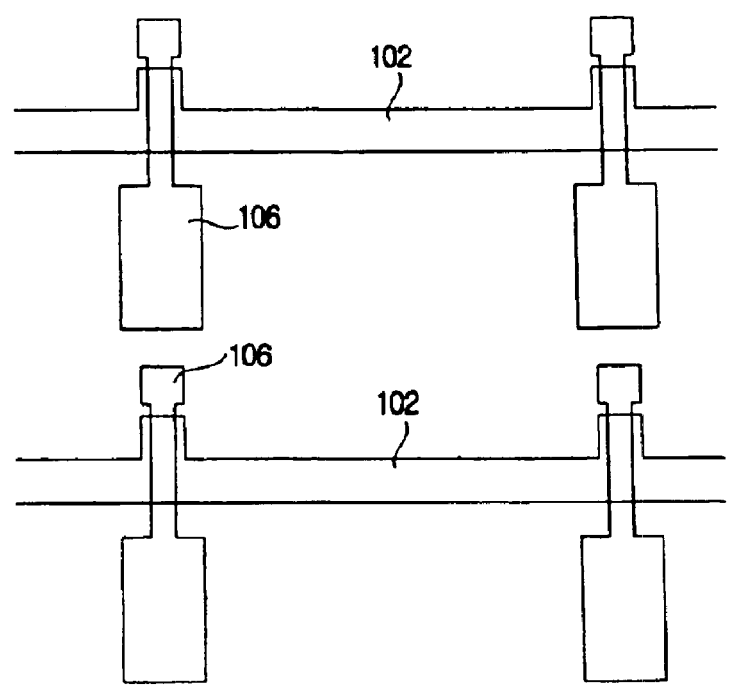

THIN FILM TRANSISTOR SUBSTRATE FOR LIQUID CRYSTAL DISPLAY (LCD) AND METHOD OF MANUFACTURING THE SAME

This application is a continuation of pending International Patent Application No. PCT/KR2002/002345 filed Dec. 12, 2002 which designates the United States and claims priority of pending Korean Patent Application Nos. 2001-78436 filed Dec. 12, 2001 and 2002-78738, filed Dec. 11, 2002.

FIELD OF THE INVENTION

The present invention relates to a thin film transistor substrate for a liquid crystal display and fabrication method thereof, and more particularly, to a thin film transistor substrate for a liquid crystal display and fabrication method thereof in which the black matrix layer formed on the thin film transistor substrate and the gate line formed on the black matrix layer are formed by using the same mask.

BACKGROUND ART

In an information-oriented society these days, the role of an electronic display is getting more important. All kinds of electronic displays are widely used in various industrial fields. As techniques of the electronic display field are continuously developed, various electronic displays having new functions are provided corresponding to diverse requirements of the information-oriented society.

Generally, electronic display is an apparatus for visually transmitting information to a person. That is, electronic display can be defined as an electronic apparatus, which converts an electrical information signal output from various electronic equipments into a visually recognizable Optical information signal. Also, it may be defined as an electronic apparatus serving as a bridge for connecting the person and the electronic equipments.

These electronic displays are classified into an emissive display in which the optical information signal is displayed by a light-emitting method, and a non-emissive display in which the signal is displayed by an optical modulation method such as light-reflecting, dispersing and interference phenomena, etc. As the emissive display called an active display, for example, there are a CRT (Cathode Ray Tube), a PDP (Plasma display panel), an LED (Light emitting diode) and an ELD (Eelectroluminescesnt Display), etc. And as the non-emissive display called a passive display, there are an LCD (Liquid Crystal Display) and an EPID (Eelectrophoretic Image Display), etc.

The CRT has been used in an image display such as a television and a monitor, etc., over the longest period of time. The CRT has the highest market share in an aspect of displaying quality and economical efficiency, but also has many disadvantages such as heavy weight, large volume and high power consumption.

Meanwhile, as various kinds of electronic devices are small-sized and lighter in weight along with the solidification and lower voltage and lower power driving of the electronic devices due to rapid advancement of semiconductor technologies, there is requested a flat panel type display having slimmer and lighter property as well as lower driving voltage and lower power consumption characteristic according to the new environment.

Among variously developed flat panel type displays, the LCD is much slimmer and lighter than any other displays and it has the lower driving voltage and the lower power consumption. Also, it has the displaying quality similar to that in the CRT. Therefore, the LCD is widely used in various electronic devices. Further, since the LCD can be manufactured with ease, its application is gradually wider.

The liquid crystal display is comprised of two substrates in which electrodes are formed, and liquid crystal interposed there between. The liquid crystal display is a device for performing a displaying operation by applying a voltage to the electrodes, and it realigns molecules of the liquid crystal so as to control an amount of light passing through the liquid crystal.

In these LCDs, a general structure that is being widely used includes two substrates each of which has an electrode formed thereon and a thin film transistor (TFT) for switching a voltage applied to the electrode. Generally, the electrode is formed on either one of the two substrates.

As the resolution of these LCD panels increases, the redundancy of the gate line increases too. The increase in the redundancy of the gate line elevates the possibility in the occurrence of the opening of the gate line, so that the failed pixels may be caused.

DISCLOSURE OF THE INVENTION

Accordingly, the present invention is directed to a thin film transistor substrate for a liquid crystal display and fabrication method thereof that substantially obviates one or more problems due to limitations and disadvantages of the related art.

It is an object of the invention to prevent the increase of the number of failed pixels due to the opening of the gate line by when the opening of the gate line occurs, allowing the black matrix to serve as the gate line on behalf of the opened gate line.

It is another object of the invention to maintain the boundary between the gate pattern and the gate insulating film at a good status.

Additional features and advantages of the invention will be set forth in the description which follows, and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, there is provided a thin film transistor substrate for a liquid crystal display. The thin film transistor substrate includes: a black matrix arranged between adjacent unit pixels on a transparent insulating substrate, for preventing light leakage between the adjacent unit pixels; a first oxide film formed on the black matrix; an active polysilicon layer pattern formed at an active region on the first oxide film; a second oxide film formed on a resultant substrate including the active polysilicon layer pattern, and including a first contact hole exposing a predetermined portion of the black matrix; a gate line formed on a selected area of the second oxide film and electrically contacting with the black matrix through the first contact hole; a third oxide film formed on a resultant substrate including the gate line; a data line formed on the third oxide film and perpendicular to the gate line; a planarizing film formed on the third oxide film including the data line; and a pixel electrode formed on the planarizing film.

Preferably, the black matrix and the gate line have the same pattern shape.

Preferably, the first oxide film has a thickness that is equal to a thickness of the second oxide film formed on the active polysilicon layer pattern.

Alternatively, either the black matrix or the gate line has an island structure.

To further achieve these and other advantages and in accordance with the purpose of the present invention, there is provided a method for fabricating a thin film transistor substrate for a liquid crystal display. The method includes the steps of: forming a black matrix between adjacent unit pixels on a transparent insulating substrate, for preventing light leakage between the adjacent unit pixels; forming a first oxide film on the black matrix; forming an active polysilicon layer pattern at an active region on the first oxide film; forming a second oxide film on a resultant substrate including the active polysilicon layer pattern; forming a first contact hole exposing a selected portion of the black matrix at a selected portion of the second oxide film; forming a gate line on a selected area of the second oxide film, and the first contact hole; forming a third oxide film on a resultant substrate including the gate line; forming a second contact hole exposing a predetermined portion of the active polysilicon layer pattern at a predetermined portion of the third oxide film; forming a data line on the third oxide film and the predetermined portion of the third oxide film; forming a planarizing film on the third oxide film including the data line; and forming a pixel electrode on the planarizing film.

Preferably, the black matrix and the gate line are formed by using a same mask.

To further achieve these and other advantages and in accordance with the purpose of the present invention, there is provided a thin film transistor substrate for a liquid crystal display. The thin film transistor substrate includes: a black matrix between adjacent unit pixels on a transparent insulating substrate, for preventing light leakage between the adjacent unit pixels; a first oxide film formed on the black matrix and having a first contact hole exposing a predetermined portion of the black matrix; an active polysilicon layer pattern including a first active polysilicon layer pattern formed at an active region on the first oxide film and a second active polysilicon layer pattern formed in the first contact hole and contacting with the black matrix; a second oxide film formed on the active polysilicon layer pattern; a gate line formed on a selected area of the second oxide film; a third oxide film formed on a resultant substrate including the gate line; a data line formed on the third oxide film, perpendicular to the gate line, and contacting with a source region of the first active polysilicon layer pattern through the second contact hole formed in the second oxide film; a metal pattern formed on the third oxide film and electrically connecting the gate line with the second active polysilicon layer pattern through the third contact hole formed in the third oxide film on the gate line, and a fourth contact hole formed in the third oxide film on the second active polysilicon layer pattern and the underlying second oxide film; a planarizing film formed on the third oxide film including the data line; and a pixel electrode formed on the planarizing film.

Preferably, the gate line has an island structure or a structure jumped by the metal line.

To further achieve these and other advantages and in accordance with the purpose of the present invention, there is provided a method for fabricating a thin film transistor substrate for a liquid crystal display. The method includes the steps of: forming a black matrix between adjacent unit pixels on a transparent insulating substrate, for preventing light leakage between the adjacent unit pixels; forming a first oxide film on the black matrix; forming a first contact hole exposing a predetermined portion of the black matrix at a predetermined portion of the first oxide film; forming a first active polysilicon layer pattern at an active region on the first oxide film and a second active polysilicon layer pattern contacting with the black matrix in the first contact hole; forming a second oxide film on the first and second active polysilicon layer patterns; forming a gate pattern on a predetermined portion of the second oxide film; forming a third oxide film on a resultant substrate including the gate pattern; forming a second contact hole exposing a source region of the active polysilicon layer pattern, a third contact hole exposing a predetermined portion of the gate pattern, and a fourth contact hole exposing a predetermined portion of the second active polysilicon layer pattern in the third oxide film and the underlying second oxide film; forming a first data pattern contacting with the source region through the second contact hole on the third oxide film and a second data pattern connecting the gate pattern with the second active polysilicon layer pattern through the third and fourth contact holes on the third oxide film; forming a planarizing film on the third oxide film including the first and second data patterns; and forming a pixel electrode on the planarizing film.

BRIEF DESCRIPTION OF DRAWINGS

The above and other advantages of the present invention will become more apparent by describing in detail exemplary embodiments thereof with reference to the attached drawings in which:

FIGS. 1 to 3 are plan views for illustrating a fabrication process of a thin film transistor substrate for an LCD according to an embodiment of the present invention;

DETAILED DESCRIPTION OF PREFERRED EMBODIMENTS

Now, exemplary embodiments of the present invention will be described in detail with reference to the annexed drawings.

Embodiment 1

Figure 3:
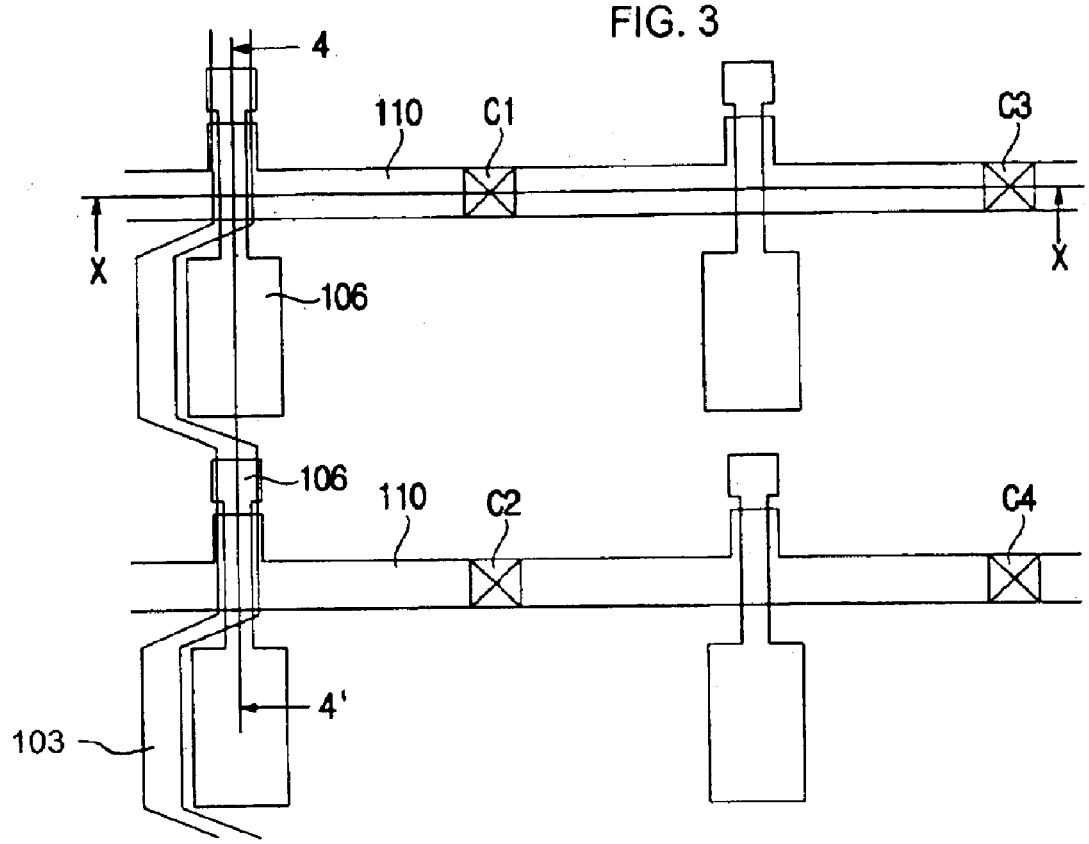
Figure 3A:
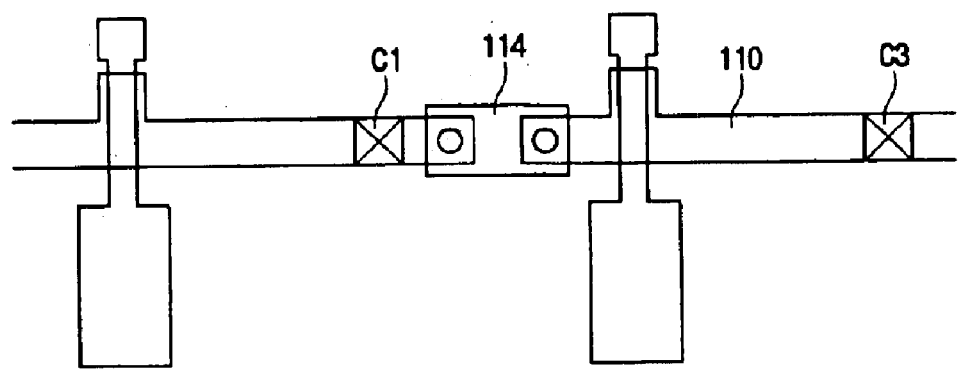
FIG. 3A is a plan view illustrating a structure of the gate line of the thin film transistor substrate where the gate line has a structure jumped by the metal line, according to one preferred embodiment of the present invention.
Figure 4:
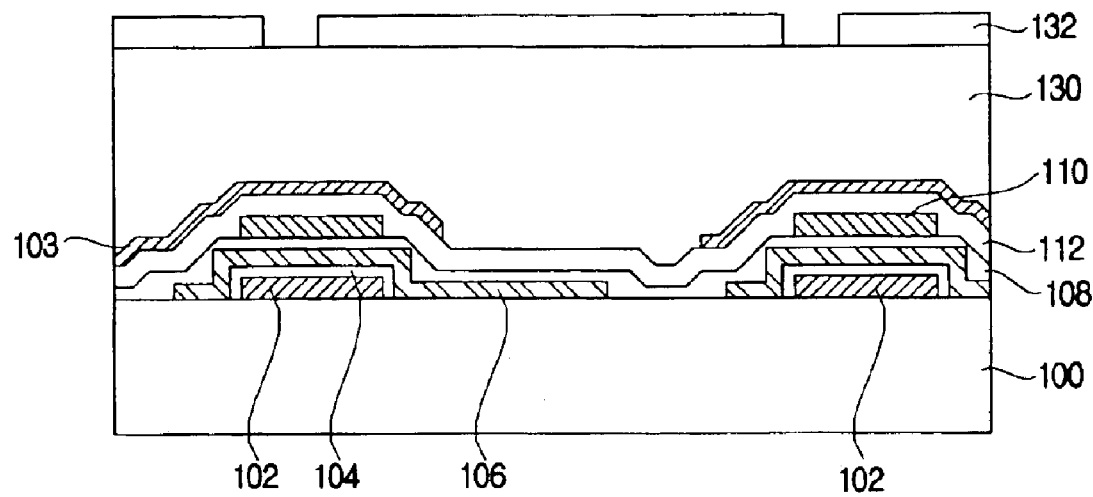
FIG. 4 is a sectional view taken along the line 4–4' of FIG. 3.

FIGS. 1 to 3A are plan views for illustrating a fabrication process of a thin film transistor substrate for an LCD according to a embodiment of the present invention, and FIG. 4 is a sectional view taken along the line 4–4' of FIG. 3.

Referring to FIG. 1, a lower black matrix pattern 102 is formed on a transparent insulating substrate 100, such as quartz ($SiO_2$) or glass by a photolithography process such that the lower black matrix pattern 102 is arranged in one direction on boundary lines of unit pixel regions ($1^{st}$ mask).

Alternatively, the black matrix pattern 102 is not separated every unit pixel but is successively formed.

On the entire surface of the substrate 100 including the black matrix pattern 102 is formed a high temperature oxide (HTO) as a first oxide film 104.

Referring to FIG. 2, an active layer pattern 106 is formed on the first oxide film 104. In other words, a heavily doped polysilicon pattern 106 is formed by a photolithography process such that it partially overlaps with the black matrix pattern 102 of a unit pixel region (Second mask).

The active pattern 106 is formed every unit pixel region.

As the active layer pattern 106, amorphous silicon can be used on behalf of the aforementioned heavily doped polysilicon. The active layer pattern 106 includes source region, drain region and channel region. These source and drain regions are formed by ion implantation process or doping process of three valence or five valence impurity ions ($3^{rd}$, $4^{th}$ masks). In case the ion implantation process is applied to, the gate line to be described later serves as an ion implantation mask.

Alternatively, the active layer pattern 106 may have a lightly doped drain (LDD) structure.

Next, a second oxide film 108, e.g., silicon oxide film is formed on a resultant substrate including the active layer pattern 106.

After that, as shown in FIG. 3, in order to electrically connect the black matrix pattern 102 with the active layer pattern 106, at least on first contact hole (C1, C2) for each unit pixel is formed in the second oxide film 108 (Five mask). The first contact hole is formed to be located on the black matrix 102.

Preferably, the second oxide film 108 formed on the active polysilicon layer pattern 106 is formed at a thickness that is equal to a thickness of the first oxide film 104.

Next, a gate pattern 110 is formed on the second oxide film 108 including the first contact hole (Sixth mask). The gate pattern 110 is formed by depositing an impurity-doped polysilicon film or a metal film, and patterning the polysilicon film or the metal film. This gate pattern 110 is patterned to have the same shape as the black matrix pattern 102 since it is patterned by a photolithography process using the second mask that was used to form the black matrix pattern 102.

The gate pattern 110 includes a gate line arranged in the width direction of the drawing, and a gate electrode branched from the gate line and overlapping with the channel region of the active layer pattern 106.

Figure 4A:
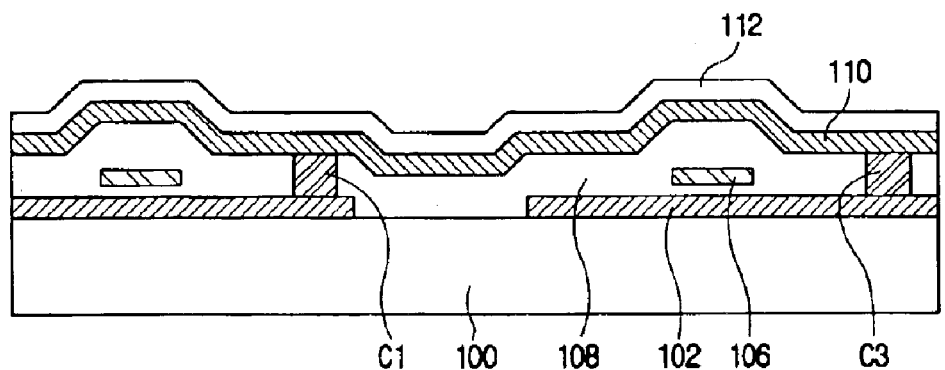
FIGS. 4A and 4B are sectional views taken along the line X—X of FIG. 3.
Figure 4B:
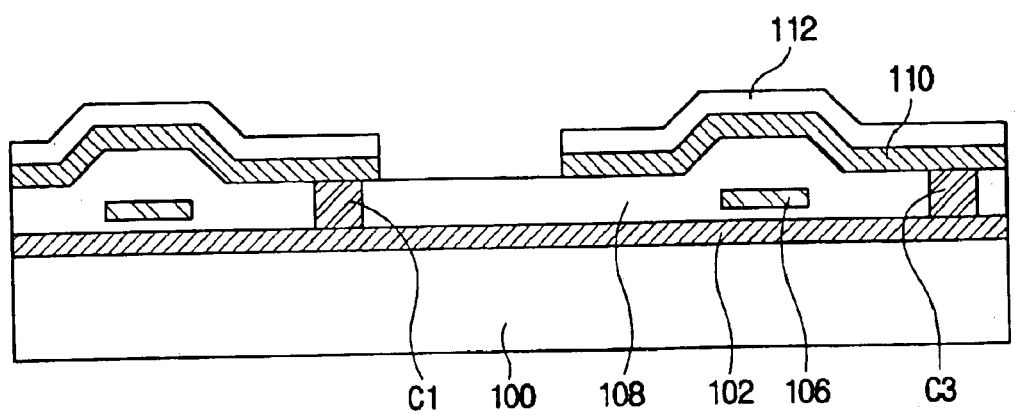

Alternatively, either the gate pattern 110 or the black matrix pattern 102 may be made in an island structure as respectively shown in FIGS. 4B and 4A.

Next, a third oxide film 112 is formed on the entire surface of a resultant substrate including the gate pattern 110.

After that, there is formed at least one second contact hole C3 and C4 (as shown in FIG. 3) exposing a predetermined portion of the third oxide film 112, e.g., source region of the active layer pattern 106 (Seventh mask).

Afterwards, a metal film for the data line 103 is deposited on the surface of the third oxide film 112 including the second contact hole. The metal film for the data line 103 is patterned by a photolithography process to form a data line as shown in FIG. 3 (Eighth mask).

Next, a planarizing film is formed on the third oxide film 112 including the data line. The planarizing film is patterned by a photolithography process to form a third contact hole (not shown) exposing the drain region of the active layer pattern 106 (ninth mask).

In the meanwhile, unit pixel regions are de med by the cross of the gate lines 110 and the data lines 103. In order to form pixel electrodes on the defined unit pixel regions, a transparent conductive film such as indium tin oxide (ITO) film or indium zinc oxide (IZO) film is deposited at a predetermined thickness, and is then patterned to form the pixel electrode contacting with the drain electrode through the third contact hole.

In the thin film transistor substrate formed by the foregoing processes, the active layer pattern 106 and the pixel electrode have a data potential which is inputted through the data line, and the black matrix pattern 102 has a gate potential since it is connected with the gate line.

Embodiment 2

Figure 5:
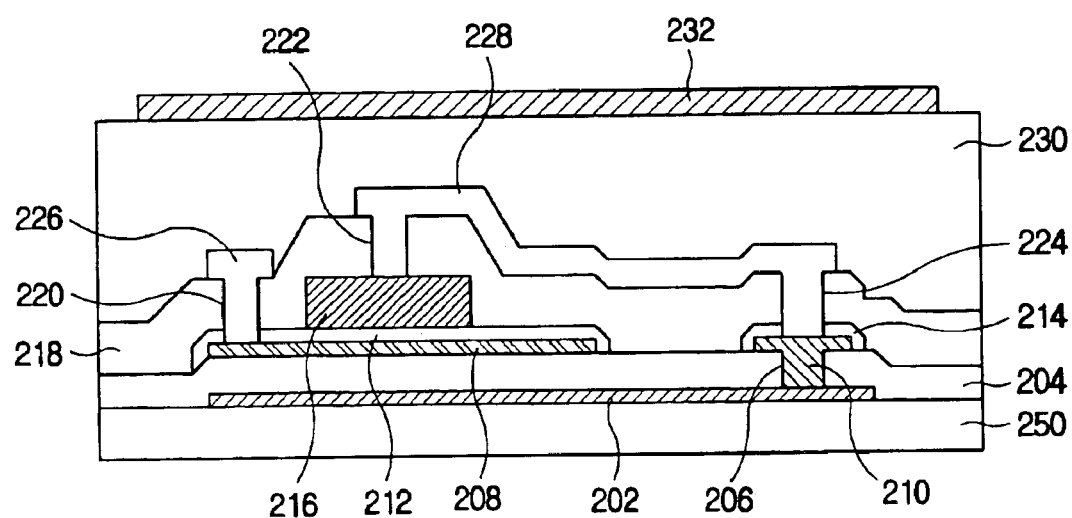
FIG. 5 is a sectional view for illustrating structure and fabrication process of a thin film transistor substrate for an LCD according to another embodiment of the present invention.

FIG. 5 is a sectional view for illustrating structure and fabrication process of a thin film transistor substrate for an LCD according to another embodiment of the present invention.

Referring to FIG. 5, a black matrix pattern 202 for preventing light leakage between unit pixels is arranged in one direction on a transparent insulating substrate 200.

A first oxide film 204 is arranged on the black matrix 202. The first oxide film 204 has a first contact hole 206 exposing a predetermined portion of the black matrix 202.

A first active polysilicon layer pattern 208 and a second active polysilicon layer pattern 210 are arranged on the first oxide film 204. The first active polysilicon layer pattern 208 is located at the active region, and the second active polysilicon layer pattern 210 is arranged at the first contact hole 206 and an adjacent portion thereof and contacts with the black matrix pattern 202. The first active polysilicon layer pattern 211 includes source region and drain region.

A second oxide film 212, 214 is arranged n the first and second active polysilicon layer patterns 208 and 210. A gate pattern 216 is arranged on a selected area of the second oxide film 212, 214. The gate pattern 216 includes a gate line arranged along the width direction of the drawing and a gate electrode branched from the gate line and overlapping with the channel region of the first active polysilicon pattern 208. Alternatively, the gate line has an island structure or a structure 114 jumped by the metal line, for example, as shown in FIG. 3A.

A third oxide film 218 is arranged on a resultant substrate including the gate pattern 216.

A data pattern 226 is arranged on the third oxide film. The data pattern 226 is perpendicular to the gate pattern 216, and contacts with the source region of the first active polysilicon layer pattern 208 through the second contact hole 220 formed in the second oxide film 212. The first data pattern 226 includes a source electrode formed on the first active polysilicon layer pattern, and a data line perpendicularly crossed with the gate line.

Also, a second data pattern 228 is arranged on the third oxide film 218. The second data pattern 228 electrically connects the gate line 216 with the second active polysilicon layer pattern 210 through the third contact hole 222 formed in the third oxide film 218, and a fourth contact hole 224 formed in the third oxide film 218 on the second active polysilicon layer pattern 210 and the underlying second oxide film 214. By the second data pattern 228 and the second active polysilicon layer pattern 210, the black matrix pattern 202 electrically contacts with the gate pattern 216, e.g., the gate line.

A planarizing film (or passivation film) 230 is arranged on the third oxide film 218 including the first and second data patterns 216 and 228. A pixel electrode 232 is arranged on the planarizing film 230.

Next, there is described a fabrication method of a thin film transistor substrate for a liquid crystal display, having the aforementioned structure. Here, the fabrication method is described below in association with only the embodiment illustrated with FIG. 5 for clarity and simplicity purposes. However, it is noted that one skilled in the art may recognize the following fabrication method is similarly applicable to the embodiment shown in FIGS. 1–4B.

A lower black matrix pattern 202 is formed on a transparent insulating substrate 200, such as quartz ($SiO_2$) or glass by a photolithography process such that the lower black matrix pattern 102 is arranged in one direction on boundary lines of unit pixel regions.

Alternatively, the black matrix pattern 202 is not separated every unit pixel but is successively formed.

On the entire surface of the substrate 200 including the black matrix pattern 202 is formed a high temperature oxide (HTO) as a first oxide film 204.

After that, a first contact hole 206 is formed in the first oxide film 204 by a photolithography process.

First and second active layer patterns 208, 210 are formed on the first oxide film 204 including the first contact hole 206. In other words, heavily doped polysilicon patterns 208, 210 are formed by a photolithography process such that they partially overlap with the black matrix pattern 202 of a unit pixel region.

The first and second active polysilicon layer patterns 208, 210 are formed every unit pixel region.

As the first and second active polysilicon layer patterns 208, 210, amorphous silicon can be used on behalf of the aforementioned heavily doped polysilicon. The first active polysilicon layer pattern 208 includes source region, drain region and channel region. These source and drain regions are formed by ion implantation process or doping process of three valence or five valence impurity ions. In case that the ion implantation process is applied to, the gate line to be described later serves as an ion implantation mask.

Alternatively, the first and second active polysilicon layer patterns 208, 210 may have a lightly doped drain (LDD) structure.

Next, a second oxide film 212, 214, e.g., silicon oxide film is formed on the first and second active polysilicon layer patterns 208, 210. The second oxide film 212, 214 is formed only on the corresponding first and second active polysilicon layer patterns 208, 210.

After that, a gate pattern 216 is formed on a predetermined portion of the second oxide film 212. The gate pattern 216 is formed by depositing an impurity-doped polysilicon film or a metal film, and patterning the polysilicon film or the metal film. This gate pattern 216 has the same shape as the black matrix pattern 202 since it is patterned by a photolithography process using the mask that was used to form the black matrix pattern 202.

Next, a third oxide film 218 is formed on the entire surface of a resultant substrate including the gate pattern 216.

After that, there are formed a second contact hole exposing a predetermined portion of the third oxide film 218 and/or the second oxide film 212 or 214, e.g., the source region of the first active polysilicon layer pattern 208, a third contact hole exposing a predetermined portion of the gate pattern 216, and a fourth contact hole 224 exposing a predetermined portion of the second active polysilicon layer pattern 210.

Afterwards, a metal film for the data pattern is deposited on the entire surface of the third oxide film 230 including the second, third and fourth contact holes 220, 222 and 224. The metal film for the data line is patterned by a photolithography process to form a first data pattern 226 and a second data pattern 228. By forming the second data pattern 228, the gate pattern 216 is electrically connected with the black matrix pattern 202.

Next, a planarizing film 230 is formed on the third oxide film 218 including the first and second data patterns. The planarizing film 230 is patterned by a photolithography process to form a fifth contact hole (not shown) exposing the drain region of the first active polysilicon layer pattern 208.

In the meanwhile, unit pixel regions are defined by the cross of the gate lines and the data lines. In order to form pixel electrodes on the defined unit pixel regions, a transparent conductive film such as indium tin oxide (ITO) film or indium zinc oxide (IZO) film is deposited at a predetermined thickness, and is then patterned to form the pixel electrodes contacting with the drain electrode through the fifth contact hole.

In the thin film transistor substrate formed by the foregoing processes, the first active polysilicon layer pattern 208 and the pixel electrode 232 have a data potential which is inputted through the data line, and the black matrix pattern 202 has a gate potential since it is connected with the gate line.

In addition, in the first embodiment, since the photolithography process is performed prior to the deposition of the gate pattern so as to form the contact hole exposing a predetermined portion of the black matrix pattern, the boundary between the gate pattern and the gate insulating film may be contaminated due to the presence of impurities or the like. However, the second embodiment makes it possible to maintain the boundary between the gate pattern and the gate insulating film at a good status.

INDUSTRIAL APPLICABILITY

As described previously, according to the invention, since the black matrix has the same pattern as the gate pattern, it becomes possible to decrease failures caused by the opening of the gate line. Also, since the black matrix and the gate pattern are formed by using the same mask, it is possible to enhance the yield. Further, the black matrix can serve as the gate line when the opening of the gate line occurs, so that it becomes possible to form the channel region at the active layer through the oxide film contacting with the black matrix.

While the present invention has been described and illustrated herein with reference to the preferred embodiments thereof, it will be apparent to those skilled in the art that various modifications and variations can be made therein without departing from the spirit and scope of the invention. Thus, it is intended that the present invention covers the modifications and variations of this invention that come within the scope of the appended claims and their equivalents.

What is claimed is:

1. A thin film transistor substrate for a liquid crystal display, comprising:

a black matrix arranged between adjacent unit pixels on a transparent insulating substrate, for preventing light leakage between the adjacent unit pixels;

a first oxide film formed on the black matrix;

an active polysilicon layer pattern formed at an active region on the first oxide film;

a second oxide film formed on a resultant substrate including the active polysilicon layer pattern, and including a first contact hole exposing a predetermined portion of the black matrix;

a gate line formed on a selected area of the second oxide film and electrically contacting with the black matrix through the first contact hole;

a third oxide film formed on a resultant substrate including the gate line;

a data line formed on the third oxide film and perpendicular to the gate line;

a planarizing film formed on the third oxide film including the data line; and a pixel electrode formed on the planarizing film.

2. The thin film transistor substrate of claim 1, wherein the black matrix and the gate line have the same pattern shape.

3. The thin film transistor substrate of claim 1 wherein the first oxide film has a thickness that is equal to a thickness of the second oxide film formed on the active polysilicon layer pattern.

4. The thin film transistor substrate of claim 1, wherein either the black matrix or the gate line has an island structure.

5. A method for fabricating a thin film transistor substrate for a liquid crystal display, the method comprising the steps of:

forming a black matrix between adjacent unit pixels on a transparent insulating substrate, for preventing light leakage between the adjacent unit pixels;

forming a first oxide film on the black matrix;

forming an active polysilicon layer pattern at an active region on the first oxide film;

forming a second oxide film on a resultant substrate including the active polysilicon layer pattern;

forming a first contact hole exposing a selected portion of the black matrix at a selected portion of the second oxide film;

forming a gate line on a selected area of the second oxide film, and the first contact hole;

forming a third oxide film on a resultant substrate including the gate line;

forming a second contact hole exposing a predetermined portion of the active polysilicon layer pattern at a predetermined portion of the third oxide film;

forming a data line on the third oxide film and the predetermined portion of the third oxide film;

forming a planarizing film on the third oxide film including the data line; and forming a pixel electrode on the planarizing film.

6. The method of claim 5, wherein the second oxide film is formed at a thickness that is equal to a thickness of the first oxide film.

7. The method of claim 5, wherein the black matrix and the gate line are formed by using a same mask.

8. The method of claim 5, wherein either the black matrix or the gate line is formed in an island structure.

9. A thin film transistor substrate for a liquid crystal display, comprising:

a black matrix between adjacent unit pixels on a transparent insulating substrate, for preventing light leakage between the adjacent unit pixels;

a first oxide film formed on the black matrix and having a first contact hole exposing a predetermined portion of the black matrix;

an active polysilicon layer pattern including a first active polysilicon layer pattern formed at an active region on the first oxide film and a second active polysilicon layer pattern formed in the first contact hole and contacting with the black matrix;

a second oxide film formed on the active polysilicon layer pattern;

a gate line formed on a selected area of the second oxide film;

a third oxide film formed on a resultant substrate including the gate line;

a data line formed on the third oxide film, perpendicular to the gate line, and contacting with a source region of the first active polysilicon layer pattern through the second contact hole formed in the second oxide film;

a metal pattern formed on the third oxide film and electrically connecting the gate line with the second active polysilicon layer pattern through the third contact hole formed in the third oxide film on the gate line, and a fourth contact hole formed in the third oxide film on the second active polysilicon layer pattern and the underlying second oxide film;

a planarizing film formed on the third oxide film including the data line; and a pixel electrode formed on the planarizing film.

10. The thin film transistor substrate of claim 9, wherein the first oxide film has a thickness that is equal to a thickness of the second oxide film formed on the active polysilicon layer pattern.

11. The thin film transistor substrate of claim 9, wherein the gate line has an island structure.

12. The thin film transistor substrate of claim 9, wherein the gate line has a structure jumped by a metal line.

13. A method for fabricating a thin film transistor substrate for a liquid crystal display, the method comprising the steps of:

forming a black matrix between adjacent unit pixels on a transparent insulating substrate, for preventing light leakage between the adjacent unit pixels;

forming a first oxide film on the black matrix;

forming a first contact hole exposing a predetermined portion of the black matrix at a predetermined portion of the first oxide film;

forming a first active polysilicon layer pattern at an active region on the first oxide film and a second active polysilicon layer pattern contacting with the black matrix in the first contact hole;

forming a second oxide film on the first and second active polysilicon layer patterns;

forming a gate pattern on a predetermined portion of the second oxide film;

forming a third oxide film on a resultant substrate including the gate pattern;

forming a second contact hole exposing a source region of the active polysilicon layer pattern, a third contact hole exposing a predetermined portion of the gate pattern, and a fourth contact hole exposing a predetermined portion of the second active polysilicon layer pattern in the third oxide film and the underlying second oxide film;

forming a first data pattern contacting with the source region through the second contact hole on the third oxide film and a second data pattern connecting the gate pattern with the second active polysilicon layer pattern through the third and fourth contact holes on the third oxide film;

forming a planarizing film on the third oxide film including the first and second data patterns; and forming a pixel electrode on the planarizing film.

14. The method of claim 13, wherein the second oxide film is formed at a thickness that is equal to a thickness of the first oxide film.

* * * * *